(12) United States Patent
Mangelberger et al.

(10) Patent No.: US 12,359,342 B2
(45) Date of Patent: Jul. 15, 2025

(54) METHOD FOR PULLING A SINGLE CRYSTAL OF SILICON IN ACCORDANCE WITH THE CZOCHRALSKI METHOD

(71) Applicant: SILTRONIC AG, Munich (DE)

(72) Inventors: Karl Mangelberger, Ach (AT); Walter Heuwieser, Stammham (DE); Michael Skrobanek, Freiberg (DE)

(73) Assignee: SILTRONIC AG, Munich (DE)

( * ) Notice: Subject to any disclaimer, the term of this patent is extended or adjusted under 35 U.S.C. 154(b) by 154 days.

(21) Appl. No.: 17/625,268

(22) PCT Filed: Jun. 24, 2020

(86) PCT No.: PCT/EP2020/067585
§ 371 (c)(1),
(2) Date: Jan. 6, 2022

(87) PCT Pub. No.: WO2021/004784
PCT Pub. Date: Jan. 14, 2021

(65) Prior Publication Data
US 2022/0259762 A1    Aug. 18, 2022

(30) Foreign Application Priority Data
Jul. 11, 2019   (DE) .................. 10 2019 210 254.9

(51) Int. Cl.
*C30B 15/04*     (2006.01)
*C30B 15/20*     (2006.01)
(Continued)

(52) U.S. Cl.
CPC .............. *C30B 29/06* (2013.01); *C30B 15/04* (2013.01); *C30B 15/20* (2013.01); *C30B 15/305* (2013.01); *C30B 30/04* (2013.01)

(58) Field of Classification Search
CPC ....... C30B 15/04; C30B 15/20; C30B 15/305; C30B 29/06; C30B 30/04
See application file for complete search history.

(56) References Cited

U.S. PATENT DOCUMENTS 5,800,612 A     9/1998 Shimomura et al.
2003/0145780 A1  8/2003 Dantz et al.
(Continued)

FOREIGN PATENT DOCUMENTS

JP    2015093793 A  *  5/2015 ............. C30B 29/06

OTHER PUBLICATIONS

English computer translation of JP 2015-093793 (Year: 2023).*
International Search Report for PCT/EP2020/067585 dated Oct. 2, 2020, 10 pages.

*Primary Examiner* — Matthew J Song
(74) *Attorney, Agent, or Firm* — BROOKS KUSHMAN P.C.

(57) ABSTRACT

Single silicon crystals having a resistivity of ≤20 mΩcm are pulled by the Czochralski process from a melt, by a method of pulling a first section of a neck at a first velocity whereby the diameter of a first section of the neck, with respect to the diameter of a seed crystal, tapers at a rate of ≤0.3 mm per mm neck length to a diameter of not more than 5 mm;
  pulling a second section of the neck at a pulling velocity of <0.2 mm/min for not less than 3 min, without the diameter increasing to more than 5.5 mm; and
  pulling a third section of the neck at a third pulling velocity of >2 mm/min.

17 Claims, 3 Drawing Sheets

(51) Int. Cl.
*C30B 15/30* (2006.01)
*C30B 29/06* (2006.01)
*C30B 30/04* (2006.01)

(56) References Cited

U.S. PATENT DOCUMENTS

| | | | |
|---|---|---|---|
| 2003/0209186 A1* | 11/2003 | Haga | C30B 15/22 117/13 |
| 2004/0089225 A1 | 5/2004 | Ono et al. | |
| 2009/0038537 A1* | 2/2009 | Minami | C30B 15/22 117/13 |
| 2010/0089309 A1* | 4/2010 | Soeta | C30B 15/22 117/35 |
| 2011/0056428 A1* | 3/2011 | Uto | C30B 29/06 117/35 |

* cited by examiner

METHOD FOR PULLING A SINGLE CRYSTAL OF SILICON IN ACCORDANCE WITH THE CZOCHRALSKI METHOD

CROSS REFERENCE TO RELATED APPLICATIONS

This application is the U.S. National Phase of PCT Appln. No. PCT/EP2020/067585 filed Jun. 24, 2020, which claims priority to German Application No. 10 2019 210 254.9 filed Jul. 11, 2019, the disclosures of which are incorporated in their entirety by reference herein.

BACKGROUND OF THE INVENTION

1. Field of the Invention

The invention provides a method for pulling a single silicon crystal having a resistivity of not more than 20 mohmcm by the Czochralski process from a melt.

2. Description of the Related Art

The Czochralski process comprises the pulling of a single crystal from a melt which is contained within a crucible. The single crystal is pulled from the melt in suspension on a seed crystal. Generally speaking, a neck is first crystallized at the bottom end of the seed crystal, so that dislocations move to the edge of the neck and in that way are eliminated.

US2003 0 209 186 A1 advises a method whereby the neck is to be pulled in sections: first one section at a pull rate R1, then a further section at a pull rate R2 which is lower by at least 25%, and lastly a further section at the rate R1, the diameter of each of the sections being at least approximately 5 mm.

U.S. Pat. No. 5,800,612 describes a method which provides for the formation of the neck to be subdivided into sections and automated.

The frequency of the event wherein dislocations are not completely eliminated in spite of the pulling of a neck is known to increase if highly doped single silicon crystals are pulled, these being single crystals having a comparatively low resistivity, because they contain an electrically active dopant at comparatively high concentration. On account of their positioning, such dislocations are also called center dislocations and are oftentimes only recognized in the form of center defects after the single crystal has been pulled.

In order to counter this problem, US2010 0 089 309 A1 proposes limiting the pulling velocity when pulling the neck to not more than 2 mm/min if the intention is to pull a boron-doped single crystal having a resistivity of not more than 1.5 mΩcm. In US2004 0 089 225 A1 it is said that the concentration of germanium in the single crystal ought to be linked, within certain limits, to the concentration of boron if the intention is to pull a single silicon crystal which includes a comparatively high concentration of boron and additionally germanium, in order to prevent problems arising from misfit dislocations in the deposition of an epitaxial layer on a semiconductor wafer which is cut from such a single crystal.

It is an object of the present invention to achieve a further reduction in the frequency of the stated event without being subject to particular restrictions.

SUMMARY OF THE INVENTION

These and other objects are achieved by means of a method for pulling a single silicon crystal having a resistivity of not more than 20 mΩcm by the Czochralski process from a melt, which comprises
  pulling a first section of a neck at a first pulling velocity whereby the diameter of the first section of the neck, in comparison to the diameter of a seed crystal, tapers at a rate of not less than 0.3 mm per mm neck length to a target diameter of not more than 5 mm;
  pulling a second section of a neck at a second pulling velocity of less than 0.2 mm/min over a period of not less than 3 min, without the diameter of the second section of the neck increasing to more than 5.5 mm; and
  pulling a third section of the neck at a third pulling velocity of more than 2 mm/min.

DETAILED DESCRIPTION OF THE PREFERRED EMBODIMENTS

Figure 1:
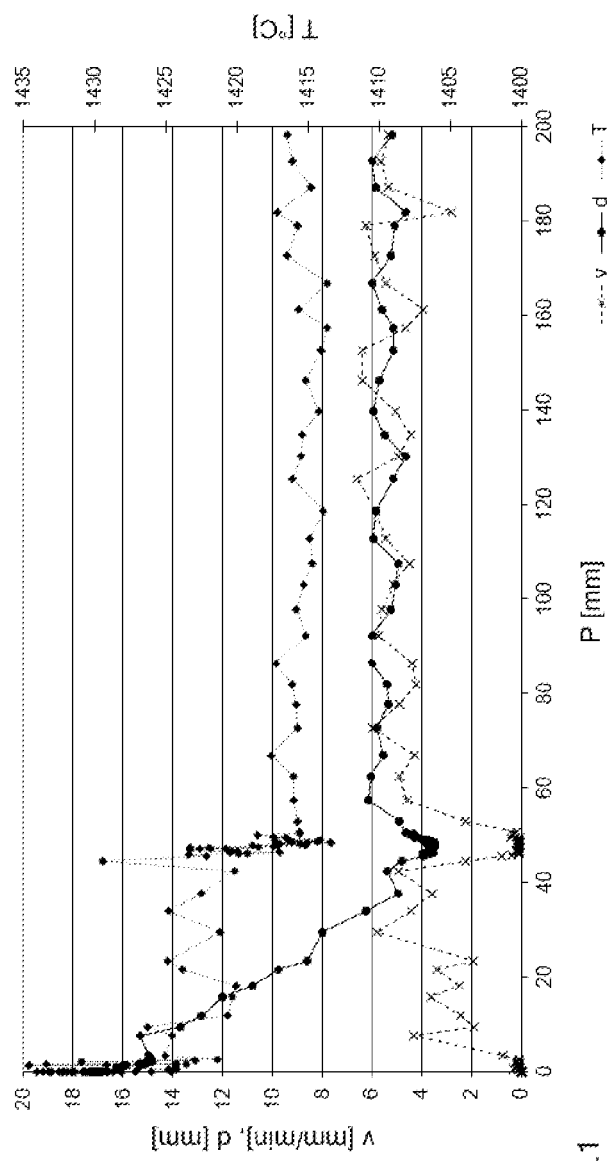
FIG. 1 depicts pulling conditions for single crystal test ingots in accordance with the invention.

In accordance with the invention the diameter of the neck is tapered comparatively quickly from the diameter of the seed crystal to the target diameter of the second section. For this purpose, the first section of the neck is pulled at a pulling velocity whereby the diameter of the neck tapers at a rate of not less than 0.3 mm per mm neck length.

The seed crystal has a round, square or rectangular cross section. The diameter is preferably 10 to 30 mm and, in the case of square or rectangular cross sections, refers to the length of the longest edge.

Furthermore, after the pulling of the first section of the neck, the pulling velocity must temporarily be lowered significantly and at the same time provision has to be made for the diameter of the neck not to increase substantially as a result. An enlargement of the diameter to not more than 5.5 mm may be regarded as an enlargement which is not yet substantial. In order to prevent the diameter becoming substantially larger because of the significant lowering of the pulling velocity, the heating power for heating the melt is preferably increased. The pulling of the second section of the neck at significantly lowered pulling velocity is maintained over a period of not less than 3 min, preferably over a period of not less than 5 min and not more than 50 min. During this period, the pulling velocity at which the second section of the neck is pulled is less than 0.2 mm/min. The value of the pulling velocity during the pulling of the second section of the neck is preferably in the range from 0.01 mm/min to less than 0.2 mm/min.

The control of the pulling of the neck preferably also includes a monitoring function which causes the pulling operation to be discontinued automatically if that diameter of the second section of the neck that is deemed permissible has been exceeded.

After the pulling of the second section of the neck, the pulling velocity is increased to a value of more than 2 mm/min, and a third section of the neck is pulled. The third section of the neck preferably has a diameter of not less than 4 mm and not more than 7 mm and a length of preferably not less than 100 mm and not more than 300 mm. Correspondingly, the heating power for heating the melt is preferably adapted as well.

The further pulling of the single silicon crystal is continued in a conventional way, specifically with the pulling of a conical section, a cylindrical section, and an end cone of the single silicon crystal. On the cylindrical section of the single crystal, monocrystalline silicon semiconductor wafers are cut off and processed.

The melt is preferably subjected to a horizontal magnetic field, at least during the pulling of the neck, of the initial cone, and of the cylindrical section of the single crystal.

The method described above is especially suitable for producing monocrystalline silicon semiconductor wafers having a diameter of at least 200 mm, more particularly having a diameter of at least 300 mm.

The efficacy of the invention was tested by pulling small test crystals of highly boron-doped, monocrystalline silicon having a diameter of 40 mm in a test series under various conditions during the neck-pulling phase. Test wafers having a diameter of 1 inch (approximately 25.4 mm) and a thickness of 1.8 mm were cut from each of the single crystals and investigated by SIRD (Scanning Infra-Red Depolarization) for lattice strains. Where procedure is in accordance with the invention, there is a fall in the detection of center defects, and hence the probability of pulling a single crystal with dislocations, to below 1%.

Figure 2:
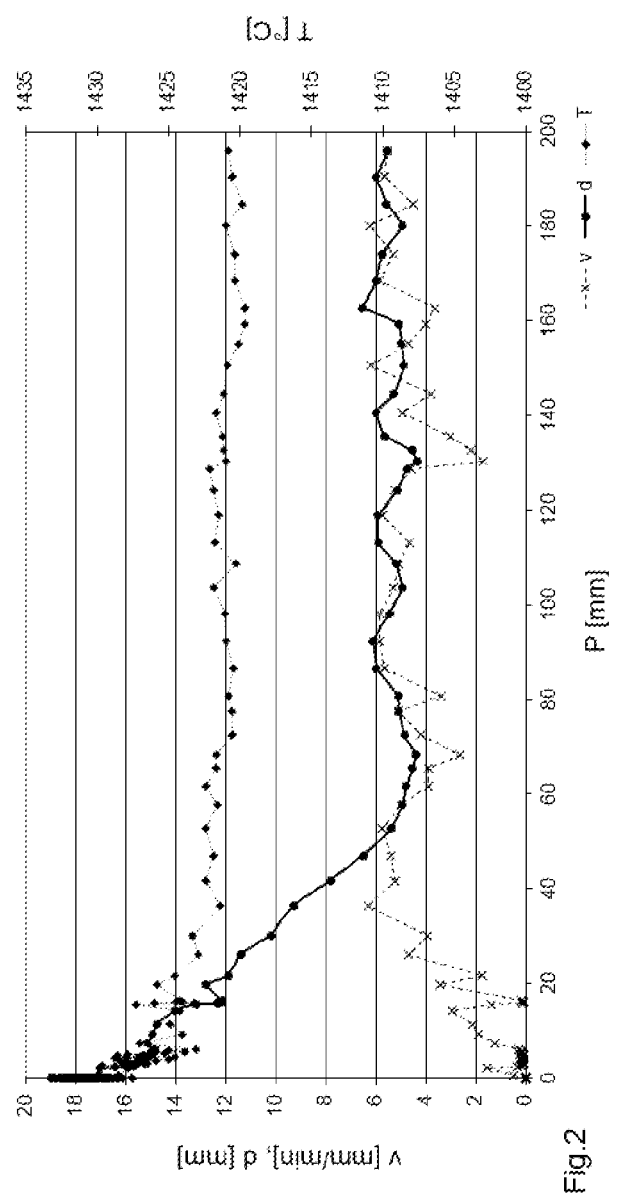
FIG. 2 depicts pulling conditions for single crystal test ingots not in accordance with the invention.
Figure 3:
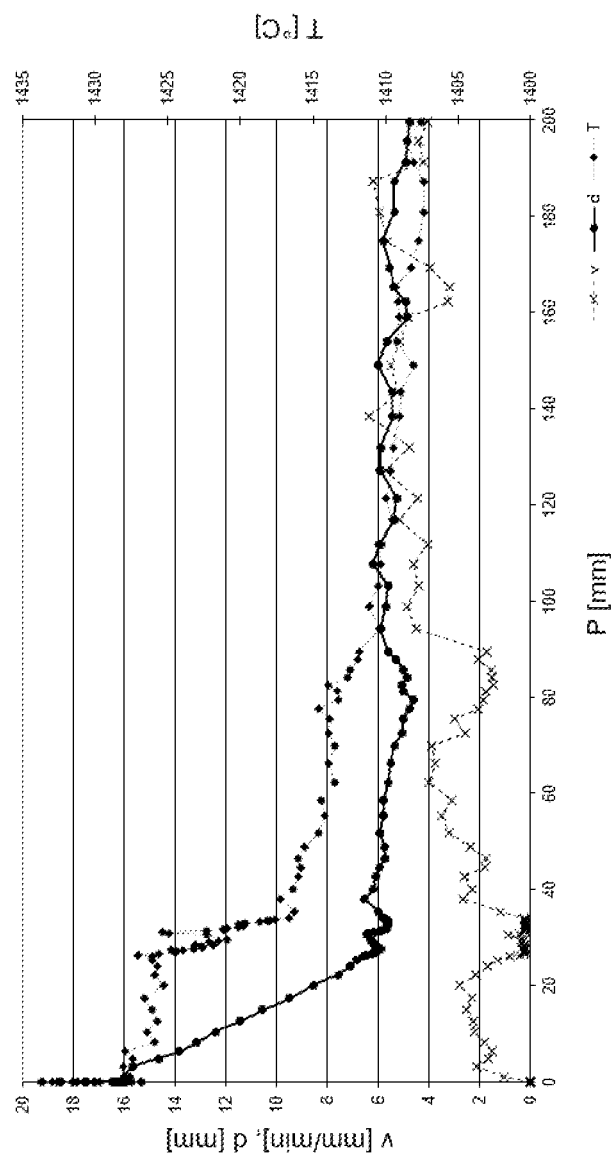
FIG. 3 depicts pulling conditions for single crystal test ingots not in accordance with the invention.

Three appended drawings, FIG. 1, FIG. 2, and FIG. 3, provide a representative depiction, over a length P of the neck, of operating conditions (FIG. 1) according to the invention and operating conditions (FIG. 2 and FIG. 3) which deviate from the former conditions, in the test series. The drawings contain information on the pulling velocity v, the diameter d of the neck, and the temperature T of the melt. The respective test wafers were free from center defects only when the operating conditions according to the invention were employed.

In the case of the operating conditions according to FIG. 2, the rate of the tapering in diameter was below the intended rate during the pulling of the first section of the neck.

In the case of the operating conditions according to FIG. 3, the diameter exceeded the diameter still deemed allowable, of 5.5 mm, during the pulling of the second section of the neck.

What is claimed is:

1. A method for pulling a highly doped monocrystalline silicon crystal by the Czochralski process from a melt, comprising the steps of:
    a) pulling a first section of a neck from a seed crystal at a first pulling velocity whereby the diameter of the first section of the neck, in comparison to the diameter of the seed crystal, tapers at a rate of not less than 0.3 mm per mm neck length to a target diameter of not more than 5 mm;
    b) pulling a second section of a neck at a second pulling velocity of less than 0.2 mm/min over a period of not less than 3 min, without the diameter of the second section of the neck increasing to more than 5.5 mm;
    c) pulling a third section of the neck at a third pulling velocity of more than 2 mm/min; and
    d) pulling a cylindrical section of the highly doped monocrystalline silicon crystal, wherein the highly doped monocrystalline silicon crystal has a resistivity of not more than 20 mΩcm, and is free of center dislocations.

2. The method of claim 1, wherein the melt is subjected to a horizontal magnetic field.

3. The method of claim 1, wherein the resistivity is established by means of boron or arsenic with which the melt is doped.

4. The method of claim 2, wherein the resistivity is established by means of boron or arsenic with which the melt is doped.

5. The method of claim 1, wherein the melt is doped with germanium.

6. The method of claim 3, wherein the melt is additionally doped with germanium.

7. The method of claim 1, further comprising processing at least a portion of the cylindrical section into wafers.

8. The method of claim 1, wherein directly following pulling the third section, a shoulder is grown.

9. The method of claim 1, wherein the number of monocrystalline silicon crystal cylindrical sections having dislocations is less than 1% of the total number of monocrystalline silicon crystal pullings.

10. The method of claim 1, wherein the diameter of the neck in step c) is ≥4 mm and ≤7 mm.

11. The method of claim 1, wherein the length of the neck pulled in step c) is ≥100 mm and ≤300 mm.

12. The method of claim 10, wherein the length of the neck pulled in step c) is ≥100 mm and ≤300 mm.

13. The method of claim 1, wherein the diameter of the cylindrical section is suitable for producing monocrystalline silicon wafers having a diameter of ≥200 mm.

14. The method of claim 1, wherein the diameter of the cylindrical section is suitable for producing monocrystalline silicon wafers having a diameter of ≥300 mm.

15. The method of claim 1, wherein the duration of step b) is from 5 minutes to 50 minutes.

16. The method of claim 1, wherein the diameter of the neck in step b) is the same as the diameter of the neck formed in step a).

17. The method of claim 1, wherein the diameter of the neck of step c) is 4 mm.

* * * * *